United States Patent [19]

Ganza

[11] Patent Number: 5,090,034
[45] Date of Patent: Feb. 18, 1992

[54] DUAL CHANNEL IONIZATION COUNTER

[76] Inventor: K. Peter Ganza, 2497 Nikanna Road, Mississauga, Ontario, Canada, L5C 2W8

[21] Appl. No.: 587,747

[22] Filed: Sep. 25, 1990

[51] Int. Cl.⁵ .................. H03K 21/02; H03K 21/08
[52] U.S. Cl. .................................... 377/55; 377/10; 377/28; 377/56
[58] Field of Search ............ 377/10, 28, 30, 55, 377/111, 56

[56] References Cited

U.S. PATENT DOCUMENTS

| | | | |
|---|---|---|---|
| 3,729,129 | 4/1973 | Fletcher et al. | 377/55 |
| 4,330,751 | 5/1982 | Swain | 377/55 |
| 4,395,762 | 7/1983 | Wondergem et al. | 377/20 |
| 4,468,796 | 8/1984 | Suga | 377/28 |
| 4,499,589 | 2/1985 | Geesen | 377/55 |
| 4,519,091 | 5/1985 | Chu et al. | 377/30 |
| 4,686,483 | 8/1987 | Isshiki et al. | 377/30 |

Primary Examiner—John S. Heyman
Attorney, Agent, or Firm—Ridout & Maybee

[57] ABSTRACT

An event counter has dual counting channels, each employing a ripple counter, and a timing generator supplying square wave switching signals of opposite phases to gates at the inputs of the two counters, the switching signals having a much greater periodicity than that of events to be counted, so that one, and only one, of the counters is counting at any one time. The timing generator also generates control signals to transfer a count from whichever counter is inactive to an associated latch and then reset the counter. When a counter is again enabled, the switching signal is also used to enable output from the latch of the previously stored count. This arrangement enables ripple counters to be used in an arrangement providing both continuous counting and continuous output availability.

5 Claims, 1 Drawing Sheet

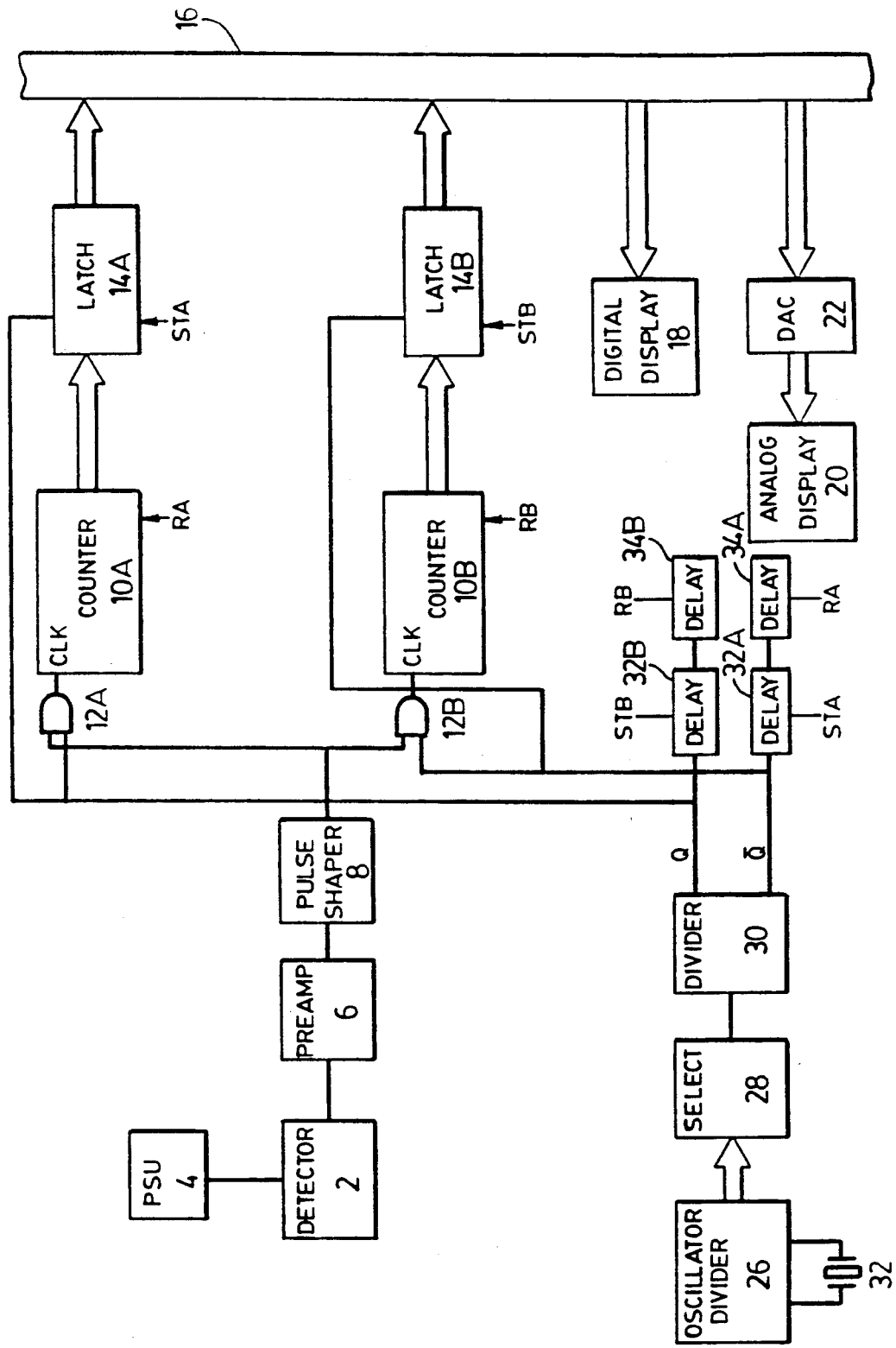

DUAL CHANNEL IONIZATION COUNTER

FIELD OF THE INVENTION

This invention relates to event or frequency counters, and more specifically though not exclusively to counters for use in monitoring ionization events in radiation detectors.

BACKGROUND OF THE INVENTION

A problem which can affect the accuracy of such counters is that of "dead time", i.e. the presence of periods in which effective counting is disabled for one reason or another, giving rise to errors or ambiguities in the counter output. One well-known form of dead time, often presented by detectors of radiation events such as Geiger-Mueller tubes, is that detection of an event disables a detector for a finite period so that a further immediately subsequent event may not be detected. The present invention is not concerned with the avoidance of dead time in such detectors, but because such devices generate "counts" which are counted, and are thus themselves frequently known as counters, it should be made clear that the counters with which the present invention is concerned are devices produced by such a detector device. Thus, in the specification that follows, the word "counter" is utilized to refer to a device that counts events, and not to a device which generates counts to mark such events.

Counters that count events occurring within a period also commonly provide a source of dead time, particularly multiple stage digital counters utilized in electronic counting instruments where allowance must be made for the time required for the count to "ripple through" a multiple stage counter. The nature of this problem and a discussion of various solutions which have been proposed are to be found in U.S. Pat. No. 4,519,091 issued May 21, 1985 to Chu et al. The solution proposed by Chu et al utilizes an uninterruptible counter having a synchronous front end, followed by a ripple counter and associated with a synchronizer to compensate for ripple through effects in the ripple counter. U.S. Pat. No. 4,395,762 issued July 26, 1983 to Wondergem et al discloses a further uninterruptible counter arrangement, in this case intended for counting events at a fixed frequency within periods set by events whose periodicity is to be measured. Pulses to be counted are applied to a ripple counter serially through a multiple stage shift register, parallel outputs from which are utilized to time the operations of the counter so that a fixed, known number of pulses will be lost each time the counter is stopped, read and reset.

In both arrangements, the use of synchronizer circuits entails restraints in that the event frequency range over which such arrangements can operate is necessarily limited both as to range and upper frequency limit. Both systems thus require a prescaler on the event input, which in the case of the Chu et al arrangement must also be synchronous, and in the Wondergem et al arrangement must be programmable, thus limiting the upper input frequency range. These systems therefore may be characterized as "synchronized" counters, rather than fully synchronous, but disadvantages of synchronous counters are only partially overcome, and they are not well suited for applications in which counting of the events over a very wide range of input repetition rates is required, with an upper end at a level at which the use of complex counter arrangements at the counter input is impracticable or uneconomic.

A further type of dead time which frequently occurs in counter arrangements, including those discussed above, is dead time whilst the counter output is updated; there will usually be a finite time during updating when the output is either unreliable or undefined.

SUMMARY OF THE INVENTION

I have now found that dead time can be eliminated in an event counting circuit over a very wide dynamic range of event repetition rates whilst utilizing ordinary ripple counters of fixed division ratio.

According to the invention, an event counter comprises a source of counts, first and second counters receiving counts from said source, each counter comprising input gate means operable to cut off counts from said source and means to reset the counter, and each counter also being associated with a latch having first control means selectively enabled to receive a count state from the counter and to hold said count state, and second control means selectively enabled to present said count state to an output, an output bus connected to the outputs of both latches, and a gating generator for generating symmetrical square wave outputs of opposite phases and a selected periodicity much greater than that of events to be counted, said outputs of opposite phase being applied to said input gate means of the two counters and to the second control means of their associated latches so that counting of one counter is enabled while a previous count state of that counter held by the associated latch is presented to the output bus, whilst counting of the other counter is disabled, said gating generator further generating control signals delayed relative to transitions of said square wave signal firstly to enable said first control means of a latch associated with that counter whose counting is disabled to receive the count state from that counter, and secondly to enable said means to reset that counter. Such an arrangement can be implemented so that every incoming count will always be captured by one counter or the other, regardless of count frequency, provided that this is within the capabilities of the components. At the same time, a counter output will always be available on the output bus from just one or the other latch, without gap or overlap, assuming competent design. There is therefore no need for the gating generator to be synchronized with any device such as a computer which accesses the bus to sample the data thereon.

Further features of the invention will become apparent from the following description with reference to the accompanying drawing.

SHORT DESCRIPTION OF THE DRAWING

The drawing is a block schematic diagram of an counter in accordance with the invention.

DESCRIPTION OF THE PREFERRED EMBODIMENT

The invention is shown applied to an instrument for detecting ionizing radiation. An ionization detector 2 produces output pulses in response to ionizing events caused by incident radiation. The detector is of a type whose output is purely digital, i.e. each radiation event produces an output pulse or count. Such devices have long been known, a familiar example being the Geiger-Mueller tube in which incident ionizing radiation triggers aids charge which is rapidly quenched by a suitable gaseous filling in the tube. Numerous other devices such as scintillation counters associated with photomultipliers are also known which have the same characteristic of producing pulses or counts in response to incident ionizing radiation. The frequency of the counts may vary over a very wide range according to the intensity of the incident radiation and the capabilities of the instrument, but some such devices are capable of producing several million counts per second.

Most such devices require a high voltage power supply 4, which will be constructed top have characteristics appropriate to the nature of the detector 2. The construction of the power supply forms no part of the present invention and is not described. Usually, it comprises a high frequency oscillator, a step up transformer and a rectifier, with some form of feed back regulator for stabilizing the output voltage.

Output pulses from the detector are applied to an appropriate preamplifier and discriminator 6 and thence to a Schmidt trigger or other pulse shaper 8 so as to provide clean pulses of appropriate amplitude and level for application to the digital circuits to be described. The preamplifier 6 and pulse shaper 8 may conveniently be implemented to an A111 integrated circuit from Amptek. The remainder of the circuit described below may be implemented utilizing conventional digital integrated circuits of whatever family is appropriate to the application. In a portable instrument, CMOS integrated circuits of the industry standard 4000 series will often provide a suitable combination of speed and low power consumption.

The output of the pulse shaper 8 is applied to the clock inputs of two ripple counters 10A and 10B, through gates 12A and 12B. The counters may conveniently be implemented by 4040 integrated circuits which provide a 12 stage ripple counter with buffered outputs from each stage, with an input providing a reset facility. The 12 bit counter outputs are applied to 12 bit latches 14A and 14B, conveniently implemented by three 4508 eight bit latch integrated circuits, one such 8 bit latch circuit and half of a further latch circuit utilizing a 4 bit latch, being required by each channel to provide the equivalent of a 12 bit latch. The latches have two control inputs, a first selecting either a first state in which they present inactive high impedance outputs, regardless of the signals at their inputs, and a second state in which the signals latched from their inputs appear at the outputs. The second control inputs latch signals from the inputs of the latches. The outputs of the latch circuits forming the 12 bit latches are connected to a common 12 bit bus 16. As shown, the bus 16 is connected to a digital display device 18 and to an analog display device 20 through a digital to analog converter 22 and a buffer amplifier 24, although such connections are exemplary only.

A clock generator comprises an oscillator and divider 26, a selector switch 28 and a further divider 30. The oscillator and divider may conveniently be implemented by a 4060 integrated circuit in conjunction with a suitable crystal 32 as frequency reference. This integrated circuit includes a 14 stage counter having outputs brought out from a number of stages, additional counter stages being provided as necessary by an additional chip. A suitable division ratio may be obtained by selecting outputs with the switch 28, the selected output being further divided by divider 30 so as to provide symmetrically complementary square wave outputs Q, $\overline{Q}$ with a periodicity double that of a desired "window" period during which counts from the detector 2 are to be counted. The outputs Q, $\overline{Q}$ are connected to the second inputs of the gates 12A, 12B such that as a final flip flop of the divider changes state in one direction, the gate 12A is disabled and the gate 12B is enabled, and vice versa. The outputs Q, $\overline{Q}$ are delayed in circuits 32A, 32B and 34A, 34B so as to strobe pulses STA and STB and reset pulses RA and RB respectively. The strobe pulses are delayed relative to the transitions of the outputs Q, $\overline{Q}$ by a period greater than the total combined propagation delays of all of the stages of either of the counters 10A, 10B. The strobe signals are applied to the second control inputs of the latch 14A or 14B associated with a counter after disabling of its associated gate so as to latch the outputs of the counter but only after a sufficient delay to ensure that ripple through of the counting process has been completed. After a further delay sufficient to ensure that the outputs have been latched, a reset pulse is applied to the counter to reset it. The first control inputs of the latches 14A and 14B also receive the outputs Q, $\overline{Q}$ so as to make the output of one and only one latch available on the bus 16; as the outputs of one latch are switched to their high impedance state, the outputs of the other are enabled, and vice versa.

In use, the selector switch 28 is adjusted to provide a dwell time (i.e. a period between transitions at the output of the divider 30) which is such that an expected number of counts during the dwell time will fall short of the full count (typically 4096) of counter 10A or 10B, but will be a sufficient portion of that count, preferably about half, to provide good resolution. This setting may be achieved not only by selecting the outputs of the counter 26, but also by adjusting the division ratio of the divider 30 which may for example include several stages of decade counters which may optionally be switched into circuit. The divider chain 30 produces true and inverted square wave outputs which alternately enable the count inputs of the counters 10A and 10B and the data outputs of the latches 14A and 14B. Thus, whilst a counter is counting, a count previously latched into its associated latch is available upon the bus 16, for display by the displays 18 and 20 or for use by other equipment connected to the bus.

When the signal Q enables counter 10A, the signal $\overline{Q}$ disables the input to counter 10B and disables the data outputs of the latch 14B by causing them to assume their high impedance state. After sufficient time has elapsed for any input count to ripple through to the counter outputs, the pulse STB is applied to latch 14B so that it latches the values of the output lines of the counter. Once sufficient time has elapsed for latching to occur, the pulse RB resets counter 10B.

At the next transition of the square wave signals at outputs Q, $\overline{Q}$ of the divider 30, the count input to counter 10A is gated off, that to the reset counter 10B is simultaneously gated on, and the count is latch 14B is made available to the bus 16 just as the output of latch 14A is disabled.

The count from one or other counter 10A, 10B is thus continuously available on the bus 16, without any gap or overlap, but with a time lag equal to the duration of one cycle of the output of divider 30. Similarly, since one or the other counter 10A, 10B is always accepting counts, counts should neither be missed nor counted twice. Whilst a finite interval is required for a final count to ripple through a counter 10A or 10B after its associated gate 12A or 12B has cut off incoming counts, and a further finite interval is required to latch the final count into the associated latch, the sum of these intervals need only be less than the period between transitions of the clock signal from the divider 30 for reliable operation to be achieved. Since that period in turn will be typically very great compared to the intervals between counts, reliable operation can be obtained up to the maximum count rate of which the counters are capable; at the other end of the scale, very low count rates can also be handled by appropriate adjustment of the selection switch 28. Such adjustment may if desired be performed automatically by assessing the counts received by the bus 16 and adjusting the division ratio of the dividers 26 and 30 to provide counts approximately equal to half the maximum count of the counters 10A and 10B.

Clearly, it is possible to make various alterations in the details of the circuit employed. The delay circuits 32A, 32B, 34A, 34B are shown as separate blocks for convenience in description, but according to the components employed, the delayed strobe and reset signals may be generated by the divider 30. The various signals employed may be inverted according to the requirements of the components used. The outputs of the latches 14A and 14B are not necessarily switched at the same time as the gates 12A and 12B, although the switching signals must be timed so that the latch outputs are not switched during loading of a count from the associated counter.

I claim:

1. An event counter comprising a source of counts, first and second counters receiving counts from said source, each counter comprising input gate means operable to cut off counts from said source and means to reset the counter, and each counter also being associated with a latch having first control means selectively enabled to receive a count state from the counter and to hold said count state, and second control means selectively enabled to present said count state to an output, an output bus connected to the outputs of both latches, and a clock generator for generating symmetrical square wave outputs of opposite phases and a predetermined periodicity much greater than that of events to be counted, said outputs of opposite phase being applied to said input gate means of the two counters and to the second control means of their associated latches so that counting of one counter is enabled while a previous count state of that counter held by the associated latch is presented to the output bus, whilst counting of the other counter is disabled, said clock generator further generating control signals delayed relative to transitions of said square wave signal firstly to enable said first control means of a latch associated with that counter whose counting is disabled to receive the count state from that counter, and secondly to enable said means to reset that counter.

2. An event counter according to claim 1, wherein the clock generator comprises an oscillator, a divider, and control means to adjust the division ratio of said divider.

3. An event counter according to claim 1, wherein said second control means of the latches and the input gate means of the associated counter are switched simultaneously.

4. An event counter according to claim 1, wherein said counters are ripple counters.

5. An event counter according to claim 1, further including a digital-analog converter connected to said output bus, and an analog display device receiving an analog output of said converter.

* * * * *